United States Patent [19]
Altekrüger et al.

[11] Patent Number: 5,587,016
[45] Date of Patent: Dec. 24, 1996

[54] CONTROLLED FEEDING CZOCHRALSKI APPARATUS

[75] Inventors: Burkhard Altekrüger; Joachim Aufreiter, both of Alzenau; Dieter Brüss, Bruchköbel; Klaus Kalkowski, Kelkheim, all of Germany

[73] Assignee: Leybold Aktiengesellschaft, Hanau, Germany

[21] Appl. No.: 556,048

[22] Filed: Nov. 13, 1995

Related U.S. Application Data

[62] Division of Ser. No. 293,428, Aug. 19, 1994, Pat. No. 5,492,078.

[30] Foreign Application Priority Data

Aug. 28, 1993 [DE] Germany ............. 43 28 982.7

[51] Int. Cl.⁶ .................................................. C30B 35/00
[52] U.S. Cl. .................. 117/214; 117/208; 117/217
[58] Field of Search ..................... 117/200, 208, 117/214, 217, 900

[56] References Cited

U.S. PATENT DOCUMENTS

| | | | |
|---|---|---|---|
| 3,998,686 | 12/1976 | Meiling et al. | 117/33 |
| 4,036,595 | 7/1977 | Lorenzini et al. | 117/214 |
| 4,547,258 | 10/1985 | Witter et al. | 117/33 |
| 4,968,380 | 11/1990 | Freedman et al. | 117/33 |
| 5,229,082 | 7/1993 | Seidensticker et al. | 117/201 |
| 5,324,488 | 6/1994 | Klingshirn et al. | 117/214 |

*Primary Examiner*—Nam Nguyen
*Assistant Examiner*—Felisa Garrett
*Attorney, Agent, or Firm*—Felfe & Lynch

[57] ABSTRACT

A source (1) is equipped with a conveying device (4) for discharging the particles (2, 2a) at adjustable rates per unit time. A crystal (16), formed from doped particles, is withdrawn from the melting crucible (13) at a predetermined rate per unit time. So that the control process can be conducted smoothly over prolonged periods of time with precise doping, the particles (2, 2a) are fed single file to the melting crucible (13) and counted by at least one sensor (21, 22). The sequence of count pulses is sent to a counter (25) and compared there with a corresponding sequence of reference input pulses. The comparison signal formed from the count pulses and the reference input pulses is used, in accordance with its sign, as a control signal for adjusting the amount of particles being discharged per unit time from source (1) to correspond to the reference value.

8 Claims, 4 Drawing Sheets

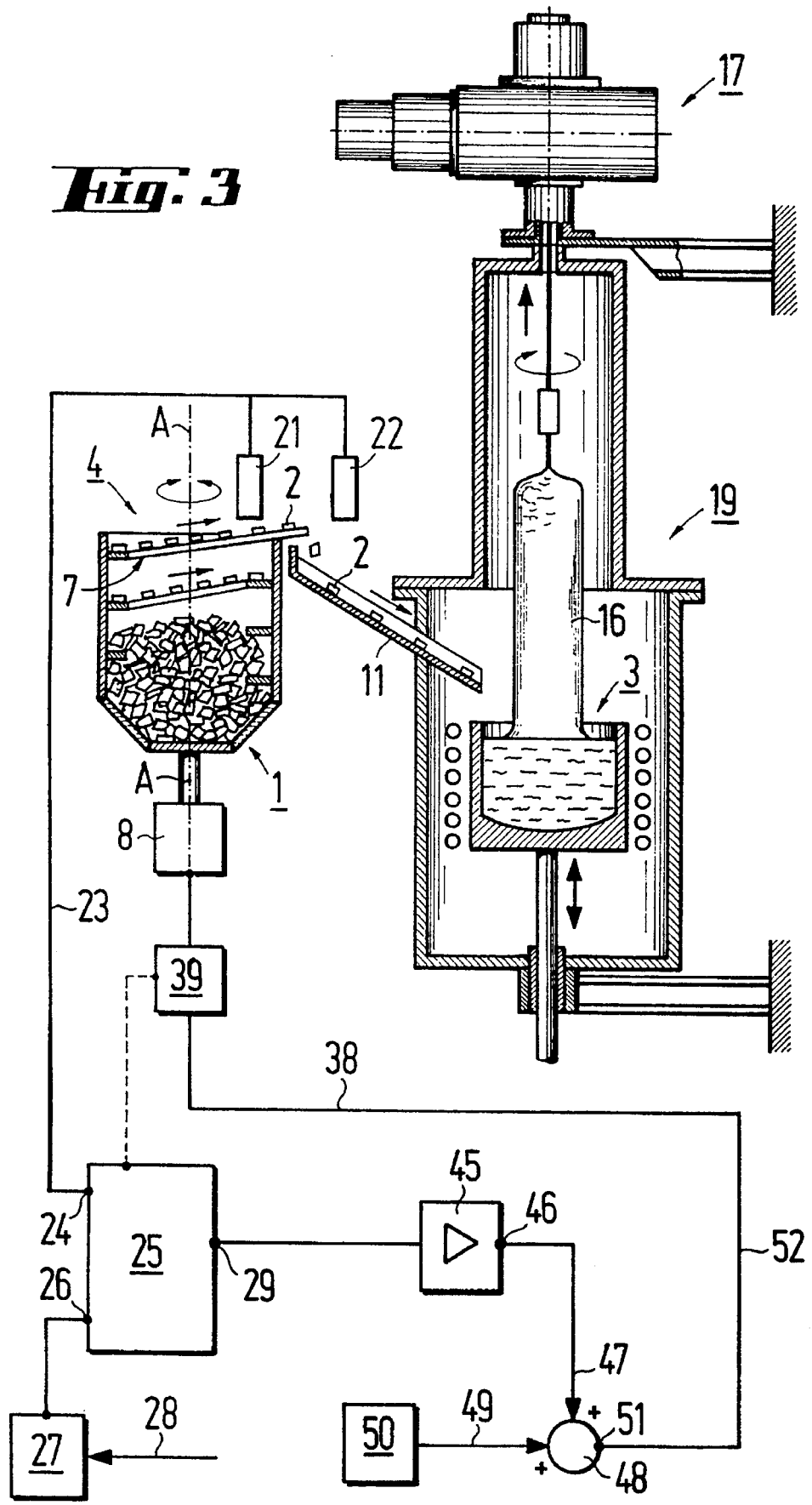

CONTROLLED FEEDING CZOCHRALSKI APPARATUS

This is a divisional application of application Ser. No. 08/293,428 filed Aug. 19, 1994, now U.S. Pat. No. 5,492,078.

BACKGROUND OF THE INVENTION

The invention pertains to a process for the controlled feeding of a melting crucible with particles during the drawing of a crystal by the Czochralski method by regulation of the flow rate of particles from a source to the melting crucible. The source is equipped with a conveying device for discharging particles in an adjustable quantity per unit time, and where a crystal with a constant diameter and a uniform dopant concentration, formed from the particles, is drawn from the melting crucible.

When crystals are drawn by the Czochralski method (CZ method), a crystal is drawn at a constant rate from a melt, which consists of doped silicon held in a heated crucible. The solid/liquid phase boundary is located near the surface of the melt. This method can be carried out in a discontinuous manner; that is, the entire amount of material required for the drawing of a single crystal, including the required dopant, is loaded into the melting crucible at the beginning, and the drawing process is terminated after most of this material has been consumed. The demand for crystals of greater length and of greater diameter is increasing, however, and thus there is a trend toward the use of continuous methods, in which the crucible is fed with a continuous supply of the doped starting material. This method is referred to as the CCD method (=continuous Czochralski drawing method).

In the method of drawing from the melt, a discontinuity occurs at the solid/liquid phase boundary with respect to the concentration of the dopants, which can include phosphorus, arsenic, antimony, and boron, depending on the desired characteristics of the materials to be obtained; that is, the amount of dopant in the drawn, solid material of the crystal is significantly less than that in the melt remaining behind in the crucible. In a discontinuous or batch process, this discontinuity leads to an increasing accumulation of dopants in the melt, as a result of which the concentration of the dopant obviously increases over time, so that the dopant concentration in the most recently drawn part of the crystal is much higher than that in the part of the crystal drawn first. The electrical resistance decreases over the length of the crystal, however, in proportion to the increase in the amount of dopant. Because this effect also increases as the crystal grows longer, continuous processes have been developed, in which the effect described above is compensated by adjusting the concentration of the dopants in the material being used to replenish the melt.

It is already known in the continuous Czochralski method that the dopants can be added to the melting crucible in the form of thin rods, which are fed continuously into the melt. The process used to obtain these rods, however, is extremely complicated, and so far it has proved impossible to obtain rods in which the desired concentration of dopants remains uniform over the entire length of the rod. In addition, the extreme brittleness of these rods makes it difficult to handle them.

A system for controlling the flow of pourable particles into the melting crucible of a crystal drawing device as a function of the weight of the particles is known from European Patent No. A1-537,988. Relatively large quantities of undoped Si base material are involved here, however, and this Si material constitutes the largest share by far of the total weight of the finished crystal. An intermediate container with an outlet tube and two shutoff valves is set up underneath a main storage bin, and a vibratory conveyor with a receiving container, which rests on a sensitive weight-measuring cell, is installed underneath the intermediate container. When the weight of the material in the receiving container falls below a predetermined value, he shut off valves of the intermediate container are opened in succession, so that the pourable particles continue to slide down into the receiving container until an upper weight limit is reached. The material is thus replenished intermittently, and it is stated that the weight-dependent control at the time of refilling the receiving container is initiated by the input of a value stored in a central processor. Nevertheless, a certain range of variation in the stream of material being conveyed cannot be prevented, because the amount discharged from the vibratory conveyor is necessarily subject to fluctuations over time.

The attempt has already been made to supply the melt with a stream of particles which have been produced by scratching a grid of squares into a standardized wafer and then by breaking the wafer into block-shaped particles with a square outline. Particles of this type are supplied in a continuous stream, that is, without any gap between them, to a detent mechanism, the detent pawl of which is designed to release individual particles at predetermined time intervals so that they can fall freely into the melt. This method of producing individual particles and releasing them in a controlled manner makes use of constraining forces of a purely mechanical nature and is based on the condition that the particles conform to extremely high standards of dimensional uniformity, which are hardly realizable in practice, and leads during actual operations to problems involving high levels of abrasion, contamination, clogging, and the fracture of the particles. As a result, jamming and clogging occur on the route to the detent mechanism and especially in the detent mechanism itself. The problems are attributable in part to the irregular shape of the particles but also in part to the different shapes of the fragments or splinters, etc., with the result that these experiments were finally abandoned.

The invention is therefore based upon the task of providing apparatus of the general type described above, which can be operated over extended periods of time without breakdowns and by means of which a precisely predetermined quantity of particles can be conveyed per unit time. The task to be accomplished in particular is to introduce a precisely predetermined quantity of dopants per unit time into the melt present in the melting crucible.

SUMMARY OF THE INVENTION

In accordance with the invention the doped particles are separated into a single file of individual particles on their way to the melting crucible and counted by at least one sensor. The sequence of count pulses is sent to a counter, where it is compared with a corresponding sequence of reference input pulses. The comparison signal derived from the comparison of the count pulses with the reference input pulses is used, according to its sign, as a control signal for adjusting the stream of separate particles being discharged per unit time from the source so that it conforms to the reference input.

Because the stream is separated into individual particles, the particles are no longer able to interfere with each other, which also means that their positions in space with respect to each other are also of secondary importance, at least as long as the individual particles can be detected reliably, i.e., counted, by the minimum of one sensor. This conveying and counting process can be carried out continuously without breakdowns over extended periods of time. Under the condition that the particles are all of the same size, it is therefore possible to adjust the flow rate of the material with precision. Under the condition that the devices used as sensors are able not only to generate a count pulse but also to determine the size of the particles, it also becomes possible in this way to achieve uniform material flow rates even when the particles are of different sizes. In this case, for example, the sensor would deal with two half-size particles as if they were one and generate only a single count pulse. With respect to larger particles, of course, the reverse of this process is conceivable.

Sensors of this type, by means of which it is also possible to determine the sizes of the particles, are known in themselves. They usually consist of a matrix of tiny photoreceptors, which is connected to a suitable evaluation circuit, which determines the particle sizes. The circuit can also determine the particle sizes, for example, by comparison with a standardized particle size.

It is especially advantageous for the particles traveling to the melting crucible to form a single file with a certain distance between the individual particles and for them to be counted in this form as they pass by the sensor.

It is obvious that certain time spans will be specified in advance for the counting of the pulses representing the actual values and the pulses representing the reference values, and that, at the end of these spans, the difference will be returned to zero or nearly zero by the control process, which will have made the appropriate adjustments.

The source can be operated in a discontinuous manner and for the conveyor leading from the source can be turned on when the total count of the reference input pulses reaches a predetermined threshold value.

The source can also be operated continuously and the drive power of the conveyor is controlled as a function of the demand for particles per unit time as determined by the counter.

The source is equipped with a conveying device for dispensing particles in adjustable quantities per unit time, and a device for the continuous drawing of a crystal with a predetermined diameter and with a predetermined dopant concentration is attached to the melting crucible.

In the control system according to the invention, an area is provided where the doped particles are put into single file along the route which the particles take to the melting crucible. The single-file area has at least one sensor to count the particles, and the output of each sensor is connected to a first input of a counter, which has a second input for a reference input element. The counter is designed in such a way that it can calculate the difference between the count pulses coming from the sensor and the reference input pulses being supplied by the reference input element. The counter output is connected to a control device with a switching element and an amplifier to drive the conveying device of the source.

By means of a design specification such as this for a control system, the same advantages are obtained.

In accordance with an advantageous further embodiment of a control system such as this, it is especially advantageous for the counter output to be connected, for the purpose of discontinuous control, to a first input of a comparator, to the second input of which the output of an adjustable threshold value indicator is connected. The comparator is designed in such a way that, when the threshold value is exceeded, the drive of the conveying device of the source is turned on and kept in operation until the counter output has returned at least essentially to a value of zero.

For the purpose of continuous control, the counter output can be connected to an adjustable amplifier, the output of which is connected to a first input of a comparator that has a second input for a reference input element. In the comparator, the amplifier output is compared with the reference input element. The output of the comparator is connected to the drive of the conveying device of the source in such a way that the discharge rate from the source per unit time can be brought into agreement, at least into essential agreement, with the quantity of material being drawn out per unit time from the melting crucible.

With respect to the constructive design of the particle-separation area, it is especially advantageous for this area to consist of at least one inclined plane and for the sensor to be installed above one of the inclined planes.

When a second inclined plane is used, which can also be designed in the form of a trough or a pipe, it is especially advantageous for the second inclined plane to be separated from the first inclined plane by a free fall and for a second sensor to be oriented toward the free fall.

Finally, with respect to the purity of the end product of crystal-drawing by the Czochralski method, it is especially advantageous for all of the parts of the system which come in contact with the particles or at least the surfaces of these parts to consist of silicon and/or silicon dioxide.

Two exemplary embodiments of the object of the invention and they way in which they work are explained in greater detail below on the basis of FIGS. 1–5.

BRIEF DESCRIPTION OF THE DRAWING

FIG. 3 shows a variant of the device according to FIG. 1 with uninterrupted operation of the source, where the discharge rate of the source is controlled by an adjustable amplifier.

DETAILED DESCRIPTION OF THE PREFERRED EMBODIMENTS

Figure 1:
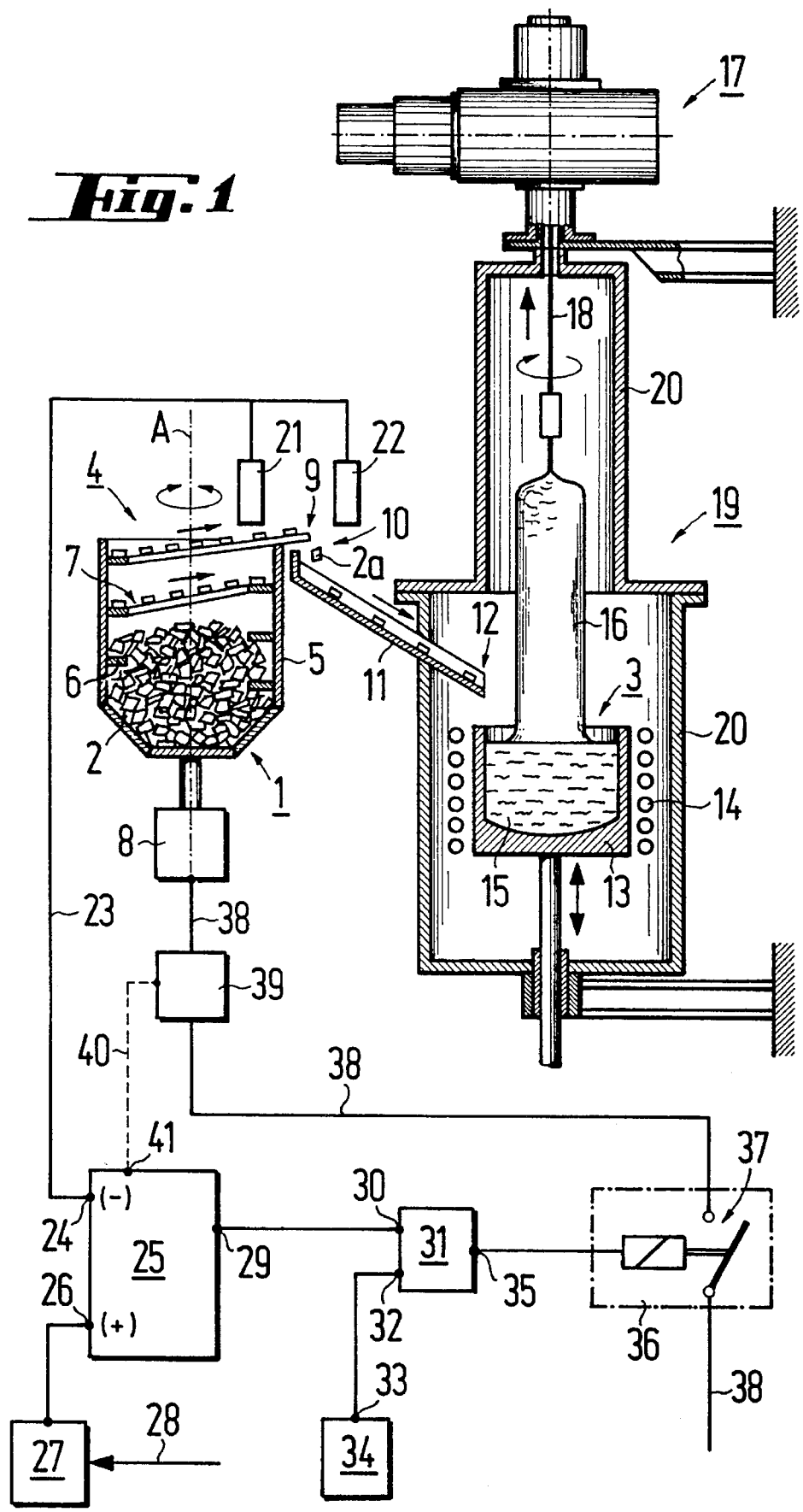
FIG. 1 shows a schematic diagram of a control system interacting with a device for the drawing of crystals by the Czochralski method, where the control is implemented on the basis of a predetermined threshold value.

FIG. 1 shows a source 1, which contains a supply of particles 2, and a container 3, which is designed as a melting crucible 13, into which these particles are fed in a controlled manner. Source 1 is equipped with a conveying device 4, which is designed as a so-called spiral conveyor 5, the cup-shaped walls of which are provided with a spirally winding first inclined ledge 6, on which the individual particles 2 are conveyed upward and out of the supply of material. As a result, the ledge forms a spirally winding plane 7, as shown in FIG. 1.

The upward movement of individual particles 2 occurs through the rotational vibrations of spiral conveyor 5 around its vertical axis A, these rotational vibrations being produced by a drive 8. Inclined plane 7 ends outside the lateral surface of the spiral conveyor, in such a way that the individual particles are able to drop off terminal edge 9 and fall freely, as is illustrated in conjunction with particle 2a. At this point, a so-called free fall 10 takes place. At the bottom of this free fall is the upper end of a downward-slanting second inclined plane 11, which is designed as a trough-like slide or as a pipe, and which has a gradient of no less than about 30°–35°. Lower end 12 of inclined plane 11 is located immediately above the melting crucible 13.

The melting crucible 13 is surrounded by heating equipment 14. Under continuous rotation, a crystal 16 is drawn upward by the Czochralski method from the melt 15 contained in melting crucible 13; by means of an additional control device not shown here, the proper adjustments are made to ensure that the diameter of the crystal remains constant. The upper end of crystal 16 is connected by a cable 18 to a device 17, which, by way of the mass of crystal 16, effects the continuous withdrawal of material from melting crucible 13 at a predetermined rate over time. This crystal drawing device 19, which is surrounded by a gas-tight, evacuatable chamber 20, is, including device 17 for the actual drawing of the crystal 16, state of the art, so that there is no need to describe it here in any further detail. The second inclined plane 11 or a corresponding pipe passes through the wall of chamber 20 in a gas-tight manner, which can be done, for example, by means of a lock-valve such as cellular wheel sluice, not shown here in detail.

At the upper end of inclined plane 7 there is a first sensor 21, located above the plane, for counting spaced apart particles 2 which have been conducted upwards toward the right on inclined plane 7. Near free fall 10 there is a second sensor 22, by means of which the particles 2a located in free fall 10 can be counted. The two sensors 21, 22 are connected by way of multiple wire line 23 to the down-counter input 24 of a counter 25, which also has an up-counter input 26. A reference input element 27, which generates individual reference input pulses at predetermined time intervals, preferably at a predetermined frequency, is connected to input 26. The difference between the individual actual-value count pulses (from either sensor 21, 22) and the reference input count pulses is calculated in counter 25. Via input 28, which is connected to a process computer (not shown) which controls the drawing process in crystal drawing device 19, reference input element 27 receives a preset value for the frequency of the reference input pulses per unit time.

A counter output 29 is connected to a first input 30 of a comparison device 31, the second input 32 of which is connected to output 33 of an adjustable threshold value indicator 34, the function of which will be described in greater detail further below. Comparison device 31 is designed in such a way that, when the threshold value W1 is exceeded, it turns on drive 8 of conveying device 4 of source 1 and keeps it operating until counter output 29 has returned at least essentially to a value of zero.

Output 35 of comparison device 31 is connected to a switching element 36, to which an interrupter 37 for power line 38 belongs. Power line 38 leads to the previously described vibratory drive 8 for spiral conveyor 5. In power line 38 there is also a power controller 39, by means of which it is possible to set the power for drive 8 incrementally. This adjustment can be made either manually or by way of the previously described but not illustrated process computer, but also, beyond this, by way of a line 40, shown in dotted line, which connects power controller 39 to an additional output 41 of counter 25. If the counter should establish, for example, that conveying device 4 has moved out of the control region, which implies, for example, too many or too few particles 2 are being conveyed, the power being drawn by conveying device 4 can be moved back into the control region by an adjustment to power controller 39 by way of line 40. This represents an additional way in which source 1 can be controlled.

Figure 2:
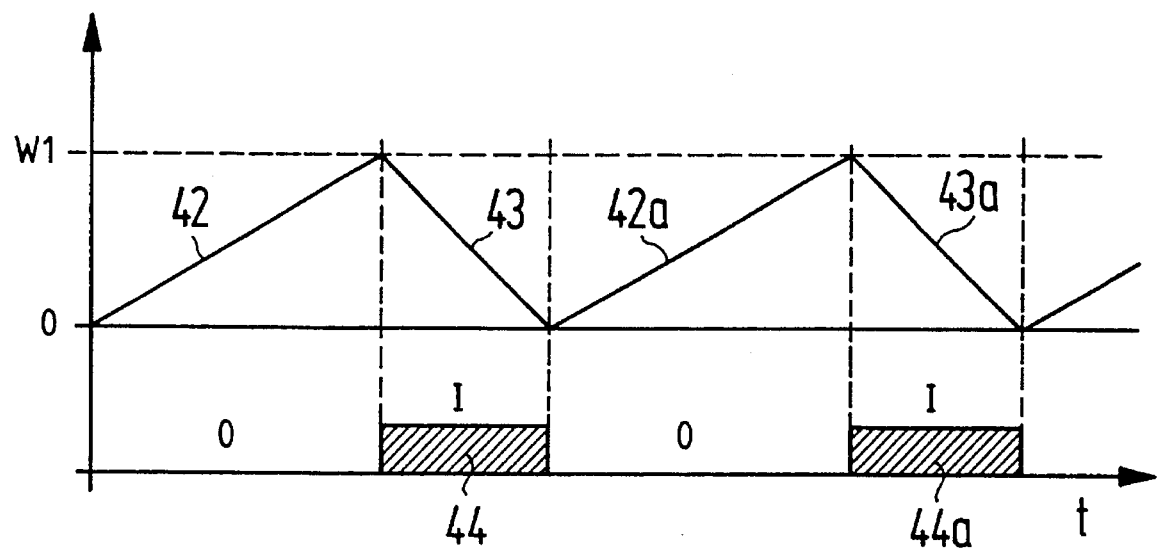
FIG. 2 shows the chronological sequence of the control process as a function of the predetermined threshold value.

The way in which the control system according to FIG. 1 operates by way of comparison device 31 can now be explained on the basis of FIG. 2. The time t is plotted in arbitrary units on the abscissa. A threshold value W1 is preset by way of threshold value indicator 34. Drive 8 of conveying device 4 is initially at rest, which is represented by the symbol "O" on the lower abscissa. In this state, therefore, no particles are being conveyed. On the basis of the pulses being received from reference input element 27, the status of counter 25 now proceeds upward to threshold value W1 is indicated by curve (a). This process is indicated by curve section 42. When threshold value W1 is reached, switching element 36 turns on drive 8 of conveying device 4. As a result, the transport of particles 2 begins immediately under the conditions illustrated in FIG. 1, and counter 25 begins to count down, this process being indicated by curve section 43. The count status is now counted back down again to zero, as a result of which drive 8 is turned off again. The duty cycle repeats, as indicated by curve sections 42a, 43a. The periods of time during which drive 8 is turned on are represented in curved (b) by shaded rectangles 44, 44a, to which the starting symbol "I" belongs. In between there is another idle phase, which is indicated by the symbol "O". This control system is a quasi-continuous type of control. The lower threshold value W1 is set, as a result of which the number of "power-on" pulses 44, 44a for drive 8 increases and the respective "power-on" times decrease, the closer is the approach to a continuous type of control.

The top of FIG. 3 shows the same details of the device as that illustrated in FIG. 1, for which reason only some of the reference symbols are repeated. The control system differs, however, from that shown in FIG. 1 as follows: Counter output 29 is, for the purpose of continuous control, connected to an adjustable amplifier 45, output 46 of which is connected to a first input 47 of a comparison device 48, which has a second input 49. In comparison device 48, the counter output and the output of the reference input element 50 are added, and (when an input 49 is present) output 51 of comparison device 48 is connected to drive 8 of conveyor device 4 in such a way that the discharge rate from the source per unit time can be brought into agreement, at least essentially into agreement, with the rate at which material is being withdrawn per unit time from melting crucible 13. In this case, the line current is sent via power line 38 to power controller 39, which receives its reference value via output 51 and line 52. The reference input element 50 provides an "offset" signal corresponding to 20 or 30% of maximum power, this being the minimum power required to transport particles due to the load on the conveyor and frictional losses in the system.

Figure 4:
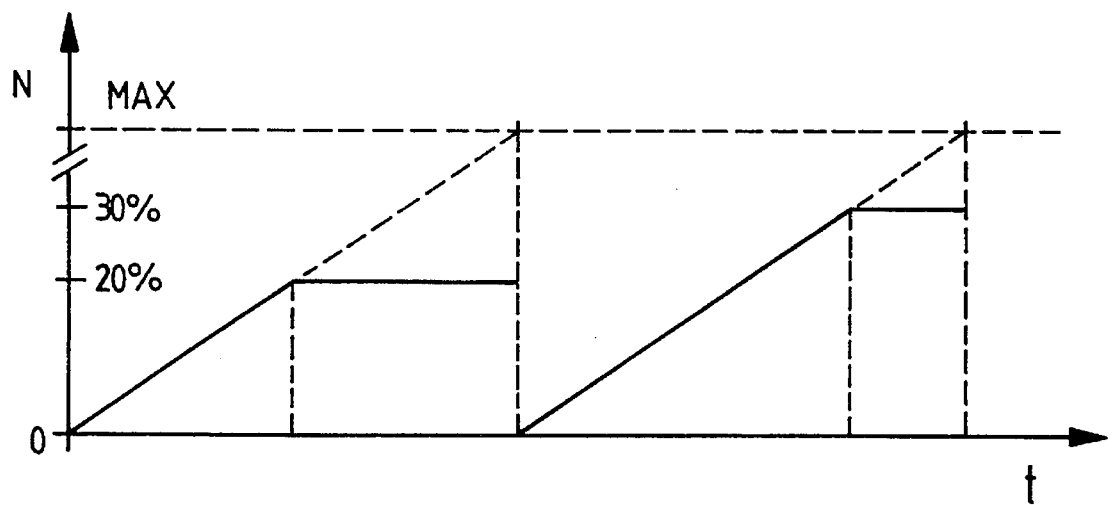
FIG. 4 shows a diagram which explains how the discharge rate of the conveying device is adjusted to the minimum value required for the source to remain able to dispense particles.

FIG. 4 provides an explanation in the form of a diagram of how the signal can be adjusted; this in turn determines the minimum drive power of conveying device 4. Time t is plotted on the abscissa; the power N being supplied to drive 8 of conveying device 4 is plotted on the ordinate. Starting from an abscissa value of 0, the power fed to drive 8 is increased gradually, until the upward transport of the particles begins at, for example, about 20% of the nominal power. This is approximately the lower limit value of the control region. In the section of the curve located to the right, the conditions are shown which occur, for example, when a greater amount of power is required to get the particles moving. In this case, for example, 30% of the nominal power is required to initiate the movement of a stream of particles. If it is desired to increase the flow rate of the material, the illustrated limit values of the control system can be adjusted to bring about a further increase in the material streams until agreement with the reference input in question is reached.

Figure 5:
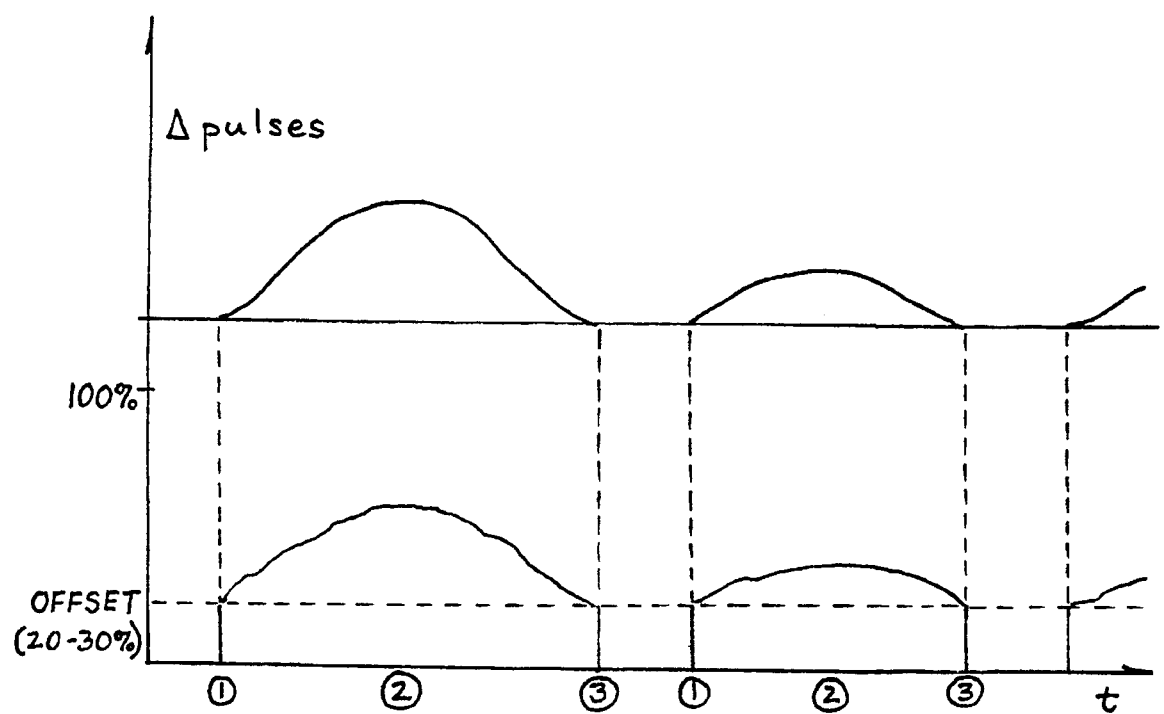
FIG. 5 is a diagram illustrating continuous control with proportional behavior.

The system of FIG. 3 permits proportionally activating the drive 8. Referring to FIG. 5, the upper curve (a) shows the difference in pulses from counter 25, and the lower curve the control voltage for power controller 39. The amplifier 45 has a proportional characteristic, so that there will be a signal 47 as soon as a small number of reference pulses from 27 are counted by counter 25. Particles are fed at a low rate beginning at (1), the rate increasing until the difference begins to decrease at (2). When the difference reaches zero at (3), the output 46 is switched off and the particle supply comes to a standstill.

We claim:

1. A control system for the controlled feeding of a melting crucible (13) with particles (2, 2a) during the drawing of a crystal (16) by the Czochralski method, said system comprising a source (1) for a supply of particles (2, 2a) and with a melting crucible (13) to receive the particles, where the source (1) is equipped with a conveying device (4) for discharging particles at an adjustable rate per unit time, and where a device (17) for he continuous drawing-out of a crystal (16) with a given diameter and a given dopant concentration is attached to the melting crucible (13), means (7, 11) for putting the doped particles into single file as the particles (2, 2a) are traveling to the melting crucible (13), at least one sensor (21, 22) for counting the particles traveling in single file, wherein the output of each sensor (21, 22) is connected to a first input (24) of a counter (25), which has a second input (24) for a reference value element (27) and which can find the difference between the count pulses of the sensor (21, 22) and the reference input pulses supplied by the reference input element; and wherein the counter output (29) is connected to a control device (switching element (36) and amplifier (35)) for the drive (8) of the conveying device (4) of the source (1).

2. A control system according to claim 1, characterized in that, for the purpose of discontinuous control, the counter output (29) is connected to a first input (30) of a comparison device (31), the second input (32) of which is connected to the output (33) of an adjustable threshold value indicator (34); and in that the comparison device (31) is designed in such a way that, when the threshold value is exceeded, it turns on the drive (8) of the conveying device (4) of the source (1) and keeps it in operation until the counter output (29) has been returned at least essentially to a value of zero.

3. A control system according to claim 1, characterized in that, for the purpose of continuous control, the counter output (29) is connected to an adjustable amplifier (45), the output (46) of which is connected to a first input (47) of a comparison device (48) that has a second input (49) for a reference input element (50); in that, in the comparison device (48), the amplifier output (46) is compared with the reference input element (50); and in that the output (51) of the comparison device (48) is connected to the drive (8) of the conveying device (4) of the source (1) in such a way that the quantity being discharged from the source per unit time can be brought at least in essentially into agreement with the amount of material being withdrawn per unit time from the melting crucible (13).

4. A control system according to claim 1, characterized in that the source (1) is designed as a spiral conveyor (5).

5. A control system according to claim 1, wherein said means for putting the doped particles into single file comprises at least one inclined plane (7, 11), said at least one sensor (21, 22) being installed above said at least one inclined plane (7, 11).

6. A control system according to claim 5, wherein said at least one inclined plane comprises a second inclined plane (11) separated from a first inclined plane (7) by a free fall (10); and said at least one sensor comprises a first sensor (21) directed toward the first inclined plane (7), and a second sensor (22) is directed toward the free fall (10).

7. A control system according to claim 1, wherein all parts of the system which come in contact with the particles have surfaces which consist of at least one of Si and $SiO_2$.

8. A control system for controlled feeding of particles to a crucible during drawing of a crystal from the crucible by the Czochralski method, said apparatus comprising source means containing particles to be fed, crucible means to which said particles are fed, conveying means for discharging particles from said source means and feeding said particles to said crucible means, said conveying means comprising a single file area where said particles are fed in single file, drive means for driving said conveying means so that said particles are discharged from said conveying means at a feed rate which is adjustable, sensing means for counting said particles in said single file area and producing a series of count pulses, means for producing a series of reference pulses, means for adding said reference pulses to form a sum, means for subtracting the count pulses from the sum of the reference pulses to obtain a difference, and control means for adjusting said feed rate based on said difference.

* * * * *